United States Patent
Fukushima

(10) Patent No.: US 7,277,332 B2
(45) Date of Patent: *Oct. 2, 2007

(54) METHOD AND CIRCUIT FOR ELASTIC STORING CAPABLE OF ADAPTING TO HIGH-SPEED DATA COMMUNICATIONS

(75) Inventor: Masanobu Fukushima, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/074,467

(22) Filed: Mar. 8, 2005

(65) Prior Publication Data

US 2005/0146950 A1    Jul. 7, 2005

Related U.S. Application Data

(63) Continuation of application No. 10/837,513, filed on Apr. 30, 2004, now Pat. No. 6,885,594.

(30) Foreign Application Priority Data

Apr. 30, 2003   (JP)  .............................. 2003-125066

(51) Int. Cl.
*G11C 7/00* (2006.01)
(52) U.S. Cl. ........................... 365/189.12; 365/189.01; 365/233

(58) Field of Classification Search ........... 365/189.12, 365/189.01, 221, 233, 189.05, 241, 230.08
See application file for complete search history.

(56) References Cited

U.S. PATENT DOCUMENTS

| 5,912,847 | A  | * | 6/1999 | Tamaki ................... 365/189.05 |
| 6,381,190 | B1 | * | 4/2002 | Shinkai ................. 365/230.03 |
| 2005/0041459 | A1 | * | 2/2005 | McDonald ................... 365/154 |

* cited by examiner

*Primary Examiner*—Van Thu Nguyen
*Assistant Examiner*—Dang Nguyen
(74) *Attorney, Agent, or Firm*—Cooper & Dunham LLP

(57) ABSTRACT

A buffer circuit includes a plurality of registers, a write register selector, a read register selector, and an address proximity detector. The write register selector operates in synchronism with a write clock signal and outputs write enable signals in a predetermined sequence for write-enabling the plurality of registers, one at a time. The read register selector operates in synchronism with a read clock signal and outputs read enable signals in the predetermined sequence for read-enabling the plurality of registers to be read, one at a time. The address proximity detector detects an event in which a difference between a register write-enabled by one of the write enable signals and a different register read-enabled by one of the read enable signals at a time in the predetermined sequence is equal to a predetermined value and outputs a reset signal upon detecting such event.

21 Claims, 9 Drawing Sheets

# METHOD AND CIRCUIT FOR ELASTIC STORING CAPABLE OF ADAPTING TO HIGH-SPEED DATA COMMUNICATIONS

CROSS REFERENCE TO RELATED APPLICATIONS

This application is a Rule 1.53(b) continuation of U.S. Ser. No. 10/837,513, filed Apr. 30, 2004 now U.S. Pat. No. 6,885,594, the entire contents of which are herein incorporated by reference.

BACKGROUND OF THE INVENTION

1. Field of the Invention

The present invention relates to a method and circuit for elastic storing, and more particularly to a method and circuit for elastic storing that is capable of adapting to high-speed data communications.

2. Discussion of the Background

A conventional buffering circuit which is sometimes called an elastic storing memory is shown in FIG. 1, which accommodates a difference between an external data receiving rate and an internal data reading rate.

As shown in FIG. 1, the conventional buffering circuit includes a two-port memory 201, a write address generator 202, a read address generator 203, a subtracter 204, and an address proximity detector 205. The subtracter 204 includes a decoder 204a. The write address generator 202 generates write addresses WADD for writing write data WDATA in synchronism with a write clock signal WCLK and outputs such write addresses WADD to the two-port memory 201. The read address generator 203 generates read addresses RADD for reading read data RDATA in synchronism with a read clock signal RCLK and outputs such read addresses signals RADD to the two-port memory 201.

As mentioned above, the write address generator 202 and the read address generator 203 operate in synchronism with the clock signals WCLK and RCLK different from each other. Data reading is generally started upon a completion of writing a predetermined amount of data into the two-port memory 201. If a frequency of the read clock signal RCLK is higher than a frequency of the write clock signal WCLK, a reading operation is faster than a writing operation and, as time passes, the read addresses RADD come closer from behind to the write addresses WADD. On the other hand, if a frequency of the write clock signal WCLK is higher than a frequency of the read clock signal RCLK, a writing operation is faster than a reading operation and, as time passes, the two-port memory 201 falls into an over flow state.

The subtracter 204 decodes a write address WADD and a read address RADD at a time by using the decoder 204a into respective values comparable to each other and calculates a distance of address between the write address WADD and the read address RADD, that is, a difference of the addresses within an address space of the two-port memory 201. A resultant signal is sent to the address proximity detector 205. The address proximity detector 205 compares the distance calculated by the subtracter 204 with a predetermined value. When the calculated distance is determined as being equal to the predetermined value, the address proximity detector 205 outputs a reset signal to the write address generator 202 and the read address generator 203 so as to initialize timings of the address signals from the write address generator 202 and the read address generator 203.

As the data communications rate is increasingly enhanced, an issue is made apparent on a time period for calculations, such as the distance subtraction by the subtracter 204 and the address comparison by the address proximity detector 205.

One attempt provides an elastic storing circuit which focuses on a specific portion of an address region in the two-port memory to predict a possible collision between the write address and the read address based on a relationship of position between the write address and the read address in the specific portion of the address region in the two-port memory. In accordance with the prediction, this elastic storing circuit outputs a reset signal to the write address generator and the read address generator. While it reduces an amount of addresses to be monitored by focusing on only a portion of the address region in the two-port memory, the elastic storing circuit according to this attempt produces the reset signal a number of times greater than that produced by the background buffering circuit of FIG. 1 in which the reset signal is output only immediately before a collision between the write address WADD and the read address RADD occurs. As a result, the elastic storing circuit of this attempt may bring about a delay in the processing speed.

SUMMARY OF THE INVENTION

This patent specification describes a novel buffer circuit which includes a memory, a write register selector, a read register selector, and an address proximity detector. The memory includes a plurality of registers. The write register selector is configured to operate in synchronism with a write clock signal and to output write enable signals in a first predetermined sequence for enabling a first selected one of the plurality of registers, one at a time, to be written with data. The read register selector is configured to operate in synchronism with a read clock signal and to output read enable signals in a second predetermined sequence for enabling a second selected one of the plurality of registers, one at a time, to be read. The address proximity detector is configured to detect an event in which a difference in position between a register write-enabled by one of the write enable signals and a different register read-enabled by one of the read enable signals among the plurality of registers is equal to a predetermined value and to output a reset signal upon detecting such event.

The above-mentioned buffer circuit may further include a duty ratio adjuster and a clock signal synchronizer. The duty ratio adjuster is configured to increase an active duty ratio indicative of a time period in which one of the write enable signals output by the write register selector is in a high state in a signal cycle in comparison with another time period remaining in the signal cycle in which the one of the write enable signals output by the write register selector is in a low state. The clock signal synchronizer is configured to synchronize the write clock signal which has undergone an increase of the active duty ratio by the duty ratio adjuster, to the read clock signal used by the read register selector. In this circuit, the address proximity detector is configured to detect an event in which a difference in position between a register write-enabled by the write enable signal which is synchronized to the read clock signal by the clock signal synchronizer and a different register read-enabled by the read enable signal among the plurality of registers is equal to the predetermined value and to output the reset signal upon detecting such event.

The above-mentioned buffer circuit may further include a read controller. The read controller is configured to detect a completion of a writing to a predetermined number of registers among the plurality of registers based on the write clock signal which has undergone an increase of the active duty ratio by the duty ratio adjuster and to activate the read register selector upon detecting such completion.

This patent specification further describes a novel buffer circuit which includes storing means, write register selecting means, read register selecting means, and address proximity detecting means. The storing means includes a plurality of registers. The write register selecting means operates in synchronism with a write clock signal and outputs write enable signals in a first predetermined sequence for enabling a first selected one of the plurality of registers, one at a time, to be written with data. The read register selecting means operates in synchronism with a read clock signal and outputs read enable signals in a second predetermined sequence for enabling a second selected one of the plurality of registers, one at a time, to be read. The address proximity detecting means detects an event in which a difference in position between a register write-enabled by one of the write enable signals and a different register read-enabled by one of the read enable signals among the plurality of registers is equal to a predetermined value and outputs a reset signal upon detecting such event.

The above-mentioned buffer circuit may further include duty ratio adjusting means, and clock signal synchronizing means. The duty ratio adjusting means increases an active duty ratio indicative of a time period in which one of the write enable signals output by the write register selecting means is in a high state in a signal cycle in comparison with another time period remaining in the signal cycle in which the one of the write enable signals output by the write register selecting means is in a low state. The clock signal synchronizing means synchronizes the write clock signal which has undergone an increase of the active duty ratio by the duty ratio adjusting means, to the read clock signal used by the read register selecting means. In this circuit, the address proximity detecting means detects an event in which a difference in position between a register write-enabled by the write enable signal which is synchronized to the read clock signal by the clock signal synchronizing means and a different register read-enabled by one of the read enable signals among the plurality of registers, one at a time, in the predetermined sequence is equal to the predetermined value, and outputs the reset signal upon detecting such event.

The above-mentioned buffer circuit may further include read controlling means. The read controlling means detects a completion of a writing to a predetermined number of registers among the plurality of registers based on the write clock signal which has undergone an increase of the active duty ratio by the duty ratio adjusting means and activates the read register selecting means upon detecting such completion.

This patent specification further describes an elastic storing method which includes the steps of providing, generating, producing, detecting, and outputting. The providing step provides a memory including a plurality of registers. The generating step generates write enable signals in a first predetermined sequence in synchronism with a write clock signal for enabling a first selected one of the plurality of registers, one at a time, to be written with data. The producing step produces read enable signals in a second predetermined sequence in synchronism with a read clock signal for enabling a second selected one of the plurality of registers, one at a time, to be read. The detecting step detects an event in which a difference in position between a register write-enabled by one of the write enable signals and a different register read-enabled by one of the read enable signals among the plurality of registers is equal to a predetermined value. The outputting step outputs a reset signal upon detecting such event.

The above-mentioned elastic storing method may further includes the steps of increasing and synchronizing. The increasing step increases an active duty ratio indicative of a time period in which one of the write enable signals is in a high state in a signal cycle in comparison with another time period remaining in the signal cycle in which the one of the write enable signals output is in a low state. The synchronizing step synchronizes the write clock signal which has undergone an increase of the active duty ratio by the increasing step to the read clock signal. In this method, the detecting step detects an event in which a difference in position between a register write-enabled by the write enable signal which is synchronized to the read clock signal and a different register read-enabled by the read enable signal among the plurality of registers is equal to the predetermined value.

The above-mentioned elastic storing method may further include the step of detecting a completion of a writing to a predetermined number of registers among the plurality of registers based on the write clock signal which has undergone an increase of the active duty ratio by the increasing step to activate the producing step upon detecting such completion.

BRIEF DESCRIPTION OF THE DRAWINGS

A more complete appreciation of the disclosure and many of the attendant advantages and features thereof can readily be obtained and understood from the following detailed description with reference to the accompanying drawings, wherein.

DETAILED DESCRIPTION OF PREFERRED EMBODIMENTS

Figure 1:
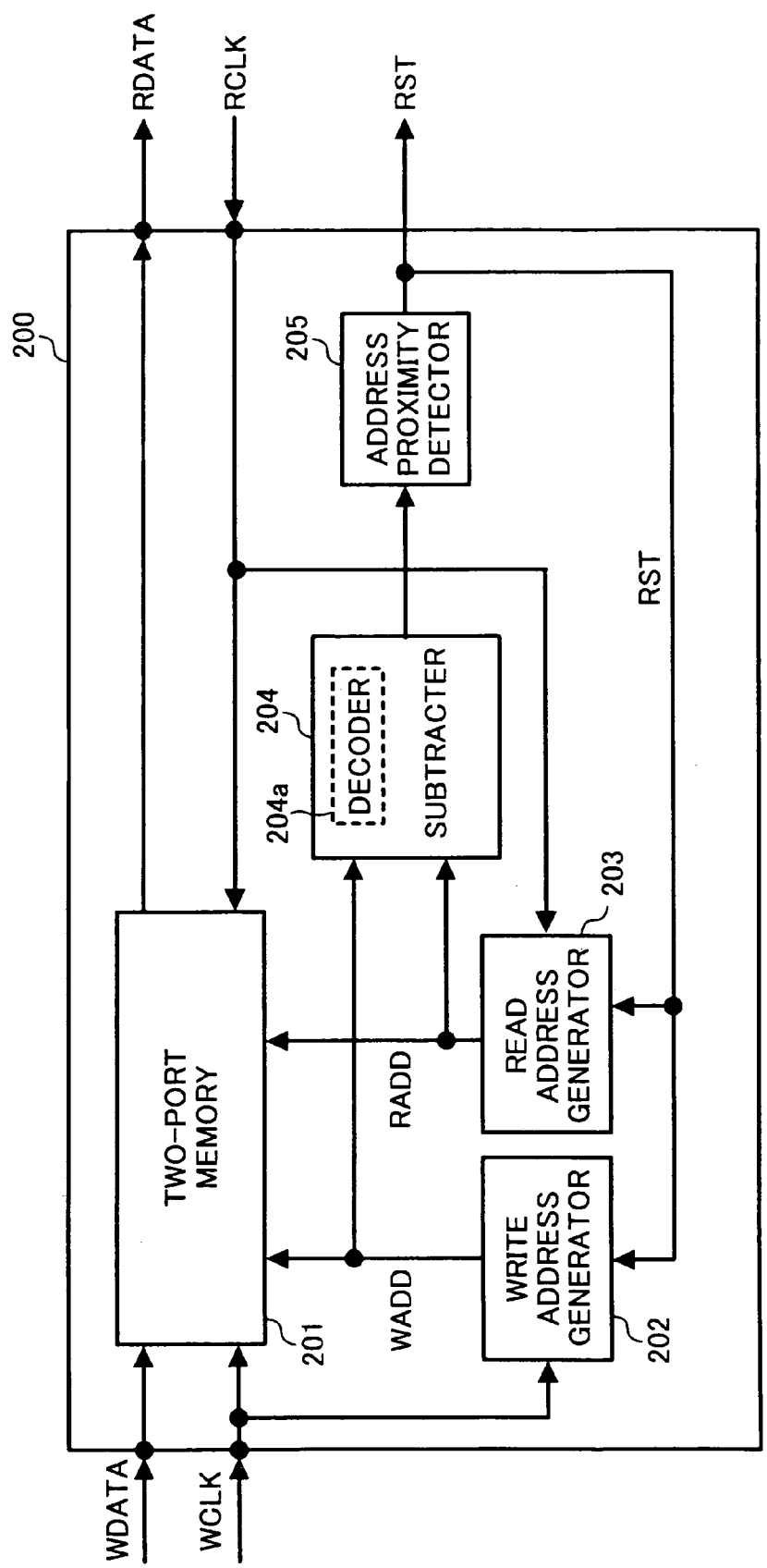
FIG. 1 is a schematic circuit block diagram of a conventional buffering apparatus.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Figure 2:
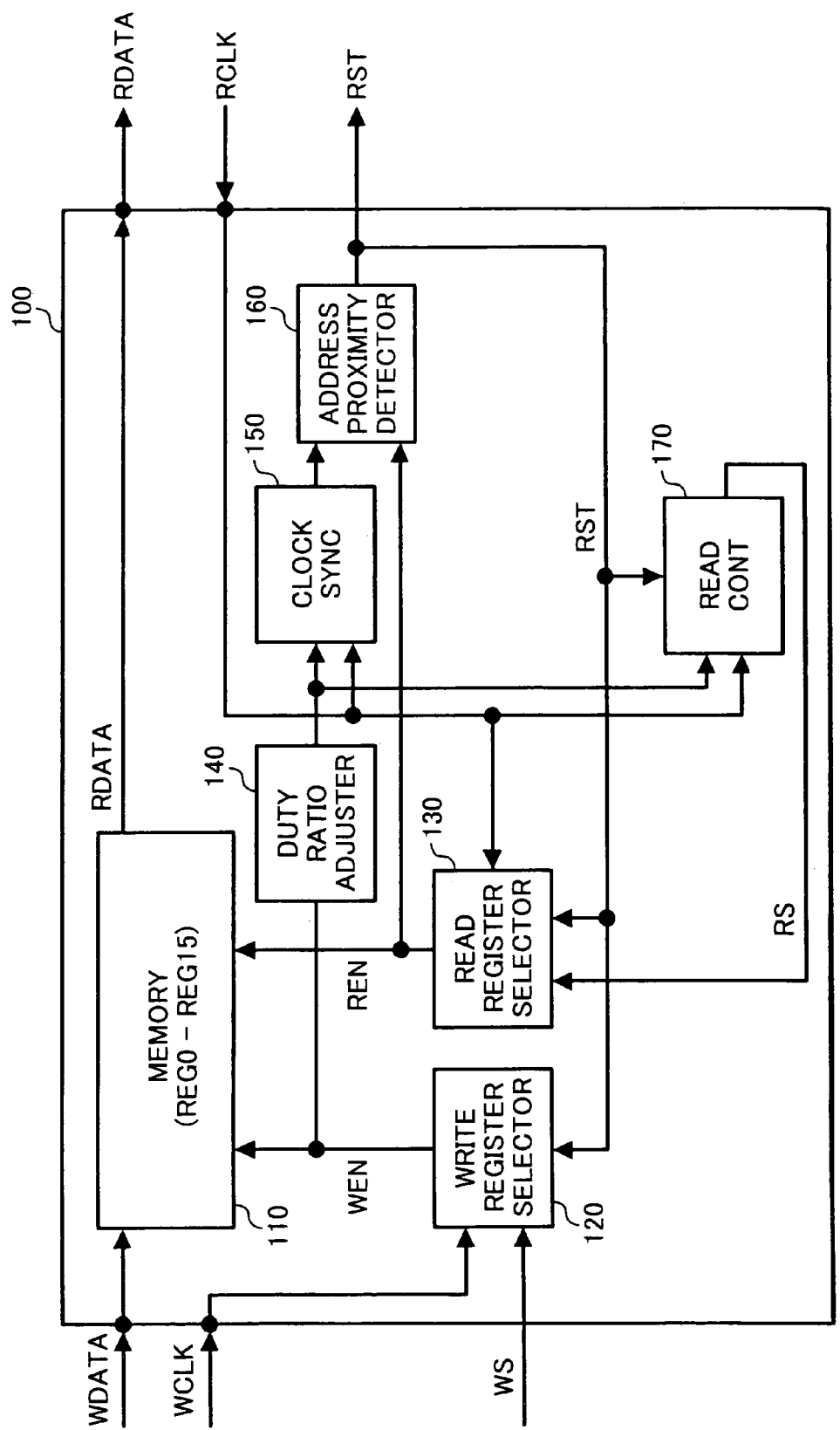
FIG. 2 is a schematic circuit block diagram of a buffering apparatus according to an embodiment of the present disclosure.

Referring now to the drawings, wherein like reference numerals designate identical or corresponding parts throughout the several views, particularly to FIG. 2, a buffer circuit 100 according to a preferred embodiment of the present disclosure is described below. As illustrated in FIG. 2, the buffer circuit 100 includes a memory 110, a write register selector 120, a read register selector 130, a duty adjustor 140, a clock synchronizer 150, an address proximity detector 160, and a read controller 170. The memory 110 includes sixteen registers REG0-REG15, each capable of storing 24-bit data. Each of the registers REG0-REG15 stores 24-bit write data WDATA in response to an input of a write enable signal WEN in a high state, and outputs the 24-bit data stored therein as 24-bit read data RDATA in response to an input of a read enable signal REN in a high state.

The write register selector 120 includes a ring counter (explained below) operating in synchronism with a write clock signal WCLK. This ring counter is connected to an enable terminal provided to each of the registers REG0-REG15 of the memory 110 and outputs a plurality of times the enable signal WEN representing data of the respective bits to the registers REG0-REG15. The ring counter here specifically is a counter circuit including a plurality of flip-flop circuits arranged in sequential stages and transmitting an output from the last-positioned flip-flop circuit to the first-positioned flip-flop. In each instance of an output, the write register selector 120 sends the write enable signal WEN in a high state to one of the registers REG0-REG15.

The read register selector 130 includes a ring counter (explained below) operating in synchronism with a read clock signal RCLK. This ring counter is connected to an enable terminal provided to each of the registers REG0-REG15 of the memory 110 and outputs a plurality of times the enable signal REN representing data of the respective bits to the registers REG0-REG15. In each instance of an output, the read register selector 130 sends the read enable signal REN in a high state to one of the registers REG0-REG15.

The structure of the buffer circuit 100 using the memory 110, the write register selector 120, and the read register selector 130, as shown in FIG. 2, is simpler than the conventional buffer circuit of FIG. 1, which needs to decode the address data into computable data. The thus-simplified structure makes the processing speed faster.

It is possible in the buffer circuit 100 that the speed of the data writing is increased and consequently a driving clock signal for the data writing may have a relatively high frequency, resulting in an extremely short cycle of such clock signal. In this case, a recognition rate of the write enable signal WEN which is output from the write register selector 120 operating in synchronism with the write clock signal WCLK is decreased in the buffer circuit 100. In order to increase this recognition rate of the write clock signal WCLK, the duty adjuster 140 increases an active duty ratio representing a ratio of a time period in which a signal maintains its active state to a cycle time of the write enable signal WEN. More specifically, the duty adjuster 140 changes the active duty ratio of the write enable signal WEN output from the write register selector 120 from 50% to 70%, and outputs a resultant signal as an enable signal DWEN to the clock synchronizer 150.

The clock synchronizer 150 synchronizes the enable signal DWEN accurately with the read clock signal RCLK, and outputs a resultant signal as a write enable signal SWEN to the address proximity detector 160.

The address proximity detector 160 compares the write enable signal SWEN synchronized with the read clock signal RCLK to the read enable signal REN, and outputs a reset signal RST in a high state when a time difference between the two clock signals corresponds to a difference of one register of the registers REG0-REG15, that is, the two clock signals SWEN and REN are immediately next to each other. The reset signal RST in a high state resets the write register selector 120 and the read register selector 130 at the same time.

It becomes possible to synchronize the write enable signals WEN0-WEN15 accurately to the read clock signal RCLK with the above-described structure having the duty adjuster 140 and the clock synchronizer 150 arranged before the address proximity detector 160 so that the buffer circuit 100 is secured to perform an accurate and high-speed operation in response to an extremely-high-speed data processing such as a rate of 480 Mbps according to the USB 2.0 standard, 1.5 Gbps according to the serial ATA standard, 2.5 Gbps according to the PCI Ex standard, etc.

The read controller 170 is started upon a completion of writing the write data WDATA to an eighth register, one of the registers REG0-REG15, counted from a first register, another one of the registers REG0-REG15, from which the writing operation of the write data WDATA is started. At this time, the read controller 170 outputs a shift enable signal RS in a high state to the read register selector 130. Upon receiving the reset signal in a high state from the address proximity detector 160, the read controller 170 changes the state of the shift enable signal RS from the high state to the low state so as to wait until the writing operation of the write data WDATA next time into the eighth register (i.e., the register REG7) of the registers REG0-REG15 is completed.

Figure 3:
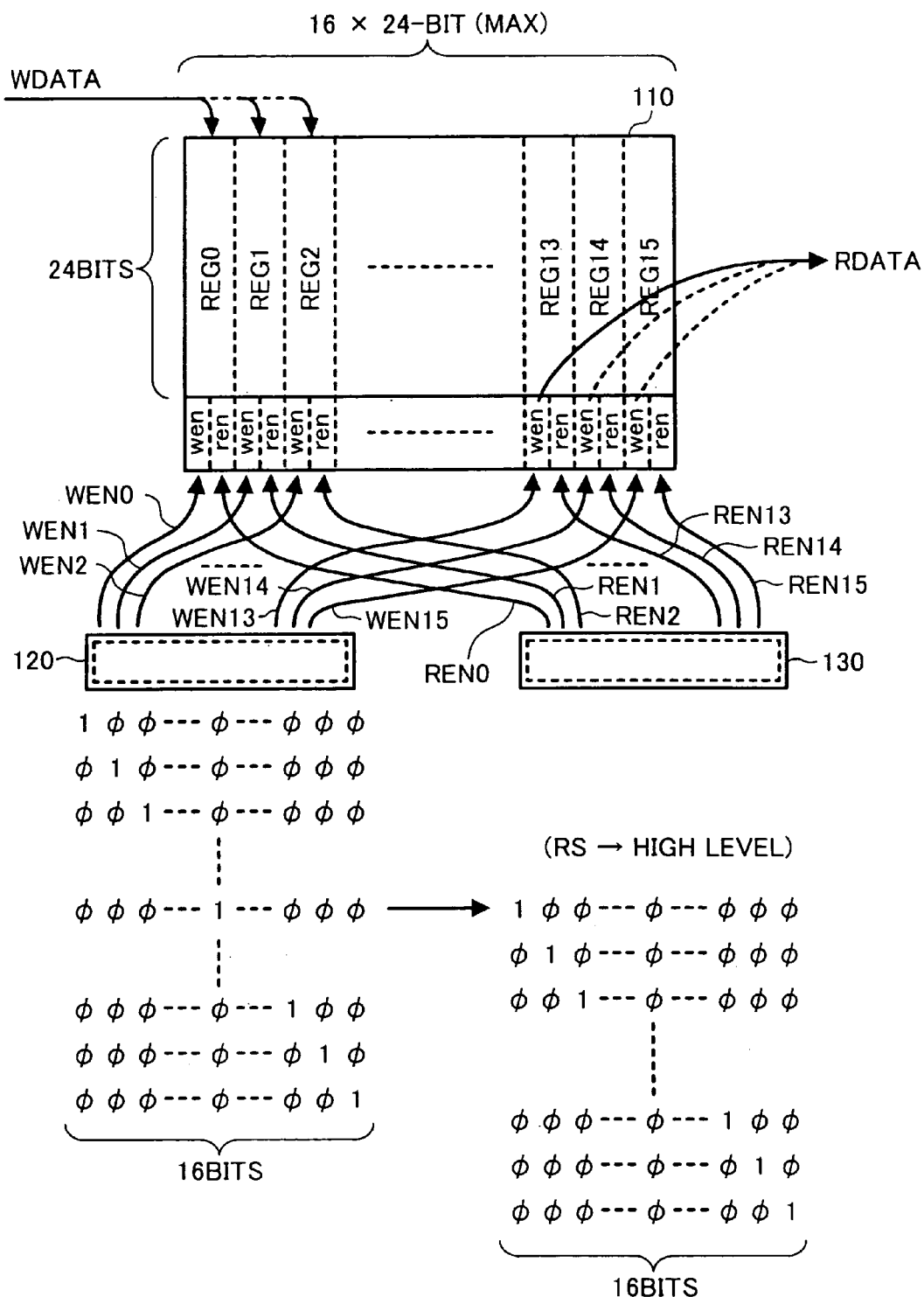
FIG. 3 is an illustration for explaining an exemplary arrangement of buffer registers and read and write enable signals.

Referring to FIG. 3, an exemplary operation in the buffer circuit 100 for selecting each of registers REG0-REG15 of the memory 110 with the write enable signals WEN0-WEN15 output from the write register selector 120 and with the read enable signals REN0-REN15 output from the read register selector 130 is described below. In this operation, a data storage involved is the sixteen 24-bit registers REG0-REG15 of the memory 110 and therefore no memory addresses to be so called exist. Each of the registers REG0-REG15 is provided with a write terminal wen for the write enable signals WEN and a read terminal ren for the read enable signals REN. The write register selector 120 is provided with sixteen signal lines corresponding to the write terminals on a one-to-one basis and the read register selector 130 is provided with sixteen signal lines corresponding to the read terminals on a one-to-one basis.

The write terminals wen of the registers REG0-REG15 allow the write data WDATA to be written in the registers in response to the write enable signals WEN0-WEN15 in a high state. Likewise, the read terminals ren of the registers REG0-REG15 outputs the read data RDATA in response to the read enable signals REN0-REN15 in a high state. In a bottom part of FIG. 3, "1" represents high states of the write enable signals WEN0-WEN15 and the read enable signals REN0-REN15 and "0" represents a low state of these signals.

The write register selector 120 sequentially generates and sends the write enable signals WEN0-WEN15 through these sixteen signal lines to the write terminals of the registers REG0-REG15, respectively. Likewise, but with a predetermined delay to the outputting of the write enable signals WEN0-WEN15 from the write register selector 120, the read register selector 130 sequentially generates and sends the read enable signals REN0-REN15 through these sixteen signal lines to the read terminals of the registers REG0-REG15, respectively. For example, as illustrated in FIG. 3, the write register selector 120 first turns on the write enable signal WEN0 into a high signal to write the write data WDATA into the register REG0 and, sequentially, turns on the subsequent write enable signals WEN1-WEN15 into respective high signals to write in turn the write data WDATA into the registers REG1-REG15. After a predetermined number of write enable signals WEN have been transmitted from the write register selector 120, the read register selector 130 first turns on the read enable signal REN0 into a high signal to read the read data RDATA from the register REG0 and, sequentially, turns on the subsequent read enable signals REN1-REN15 into respective high signals to read in turn the read data RDATA from the registers REG1-REG15.

In the example shown in FIG. 3, the write register selector 120 is started to operate in response to the external input of the write data WDATA and outputs the 16-bit write enable signals WEN as "1000 0000 0000 0000," "0100 0000 0000 0000," and so on, in synchronism with the write clock signal WCLK. In the meantime, the read controller 170 outputs the shift enable signal RS upon a completion of writing the write data WDATA into an eighth register (i.e., the register REG7) among the sixteen registers REG0-REG15 of the memory 110 counted from a first register at which the data writing is started. In response to the shift enable signal RS from the read controller 170, the read register selector 130 starts the read operation to output the 16-bit read enable signals REN as "1000 0000 0000 0000," "0100 0000 0000 0000," and so on in synchronism with the read clock signal RCLK so as to follow the write operation of the write register selector 120.

Figure 4:
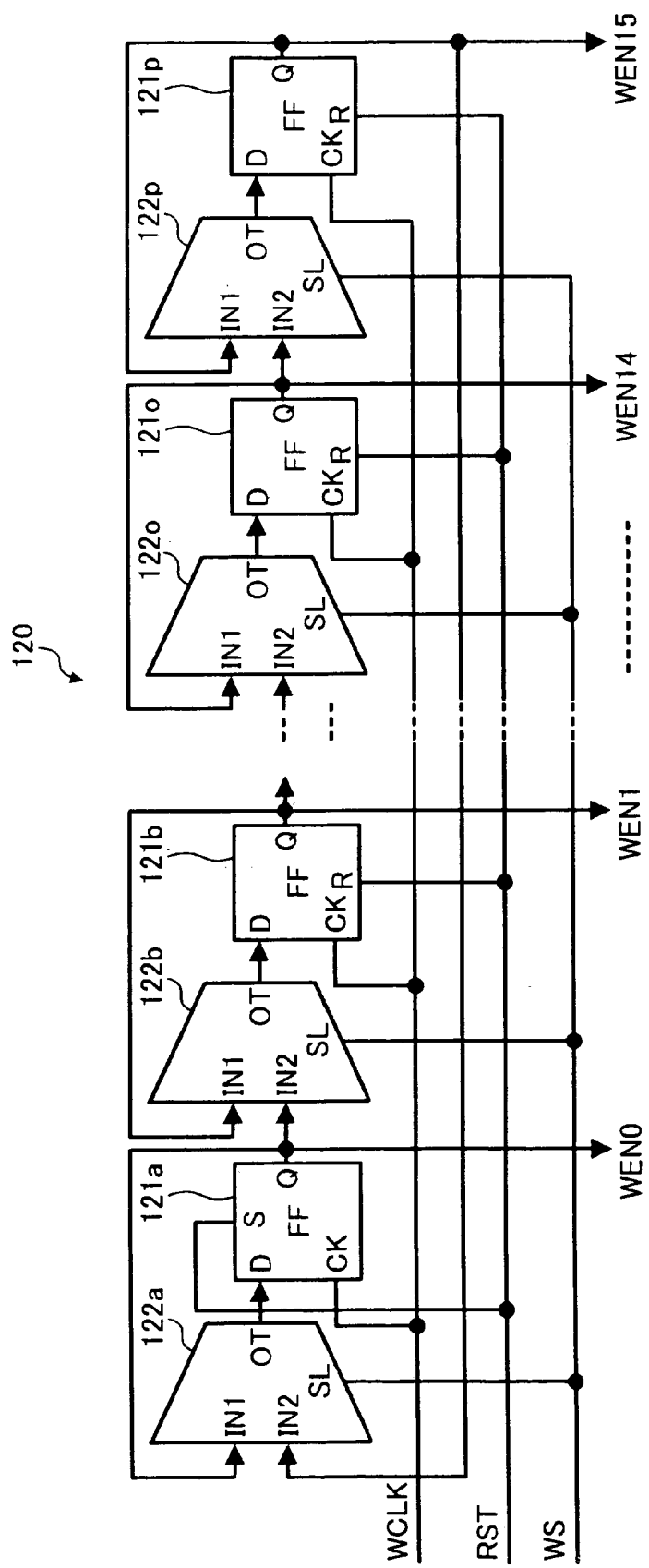
FIG. 4 is a schematic circuit block diagram of a write register selector shown in FIG. 2.

Referring to FIG. 4, further details of the write register selector 120 are explained. As shown in FIG. 4, the write register selector 120 includes sixteen D-type flip-flop (hereinafter referred to as DFF) circuits 121a-121p and sixteen multiplexers (MUXs) 122a-122p which together form a 16-bit shift register functioning as a 16-bit ring counter. Each of the DFF circuit 121a-121p has a data input terminal D, a data output terminal Q, a clock input terminal CK, a set terminal S, and a reset terminal R. The write clock signal WCLK is input to the data input terminal D of each of the DFF circuit 121a-121p. The reset signal RST is input to the set terminal S of the DFF circuit 121a and the reset terminal R of the DFF circuits 121b-121p.

Each of the multiplexers 122a-122p includes first and second input terminals IN1 and IN2, a selection terminal SL, and an output terminal OT. A shift enable signal WS sent from an external apparatus which generates the write clock signal WCLK is input to the selection terminals SL of the multiplexers 122a-122p. With the shift enable signal WS being in a low state, each of the multiplexers 122a-122p outputs the signal which is input to the first input terminal IN1, from the output terminal OT. With the shift enable signal WS being in a high state, each of the multiplexers 122a-122p outputs the signal which is input to the second input terminal IN2, from the output terminal OT.

The data input terminals D of the DFF circuits 121a-121p are connected to the output terminals OT of the multiplexers 122a-122p, respectively. The data output terminals Q of the DFF circuits 121a-121p are connected to output terminals (not shown) for the write enable signals WEN0-WEN15, respectively. The data output terminals Q of the DFF circuits 121a-121o are also connected to the second input terminals IN2 of the multiplexers 122b-122p, respectively, and to the first input terminals IN1 of the multiplexers 122a-122o, respectively. The data output terminal Q of the DFF circuit 121p is connected to the first input terminal IN1 of the multiplexer 122p and the second input terminal IN2 of the multiplexer 122a.

The write register selector 120 having the above-described structure starts its operation in response to an input of the shift enable signal WS in a high state, and sequentially transmits the sixteen write enable signals WEN0-WEN15 by raising one at a time to the write terminals wen (see FIG. 3) of the sixteen registers REG0-REG15, respectively. Also, in response to an input of the reset signal RST in a high state, the write register selector 120 transmits the write enable signal WEN0 in a high state and the write enable signals WEN1-WEN15 in a low state.

Figure 5:
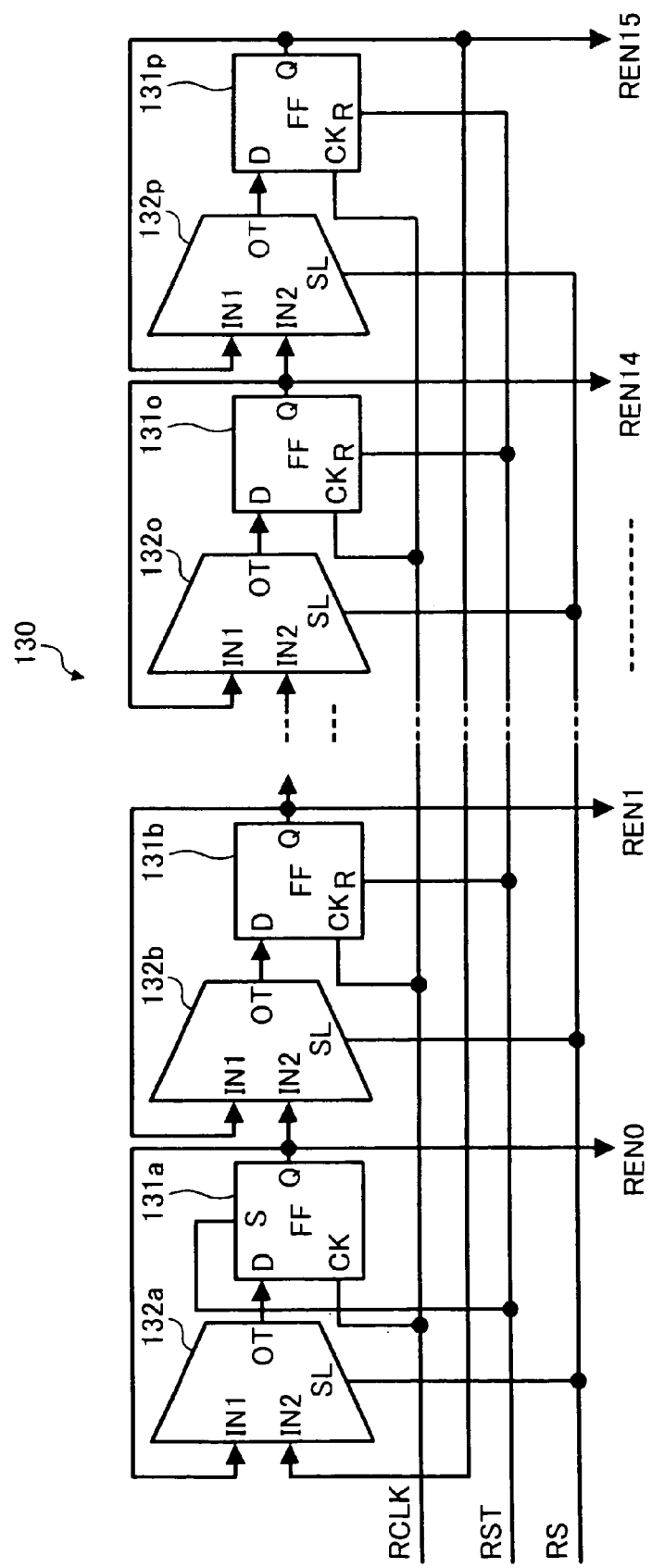
FIG. 5 is a schematic circuit block diagram of a read register selector shown in FIG. 2.

Referring to FIG. 5, further details of the read register selector 130 are explained. The structure of the read register selector 130 of FIG. 5 is similar to the write register selector 120 of FIG. 4, except for wiring connections. As shown in FIG. 5, the read register selector 130 includes sixteen D-type flip-flop (hereinafter referred to as DFF) circuits 131a-131p and sixteen multiplexers (MUXs) 132a-132p which together form a 16-bit shift register functioning as a 16-bit ring counter. Each of the DFF circuit 131a-131p has a data input terminal D, a data output terminal Q, a clock input terminal CK, a set terminal S, and a reset terminal R. The read clock signal RCLK is input to the data input terminal D of each of the DFF circuit 131a-131p. The reset signal RST is input to the set terminal S of the DFF circuit 131a and the reset terminal R of the DFF circuits 131b-131p.

Each of the multiplexers 132a-132p includes first and second input terminals IN1 and IN2, a selection terminal SL, and an output terminal OT. A shift enable signal WS sent from an external apparatus which generates the read clock signal RCLK is input to the selection terminals SL of the multiplexers 132a-132p. With the shift enable signal WS being in a low state, each of the multiplexers 132a-132p outputs the signal which is input to the first input terminal IN1, from the output terminal OT. With the shift enable signal WS being in a high state, each of the multiplexers 132a-132p outputs the signal which is input to the second input terminal IN2, from the output terminal OT.

The data input terminals D of the DFF circuits 131a-131p are connected to the output terminals OT of the multiplexers 132a-132p, respectively. The data output terminals Q of the DFF circuits 131a-131p are connected to output terminals (not shown) for the read enable signals REN0-REN15, respectively. The data output terminals Q of the DFF circuits 131a-131o are also connected to the second input terminals IN2 of the multiplexers 132b-132p, respectively, and to the first input terminals IN1 of the multiplexers 132a-132o, respectively. The data output terminal Q of the DFF circuit 131p is connected to the first input terminal IN1 of the multiplexer 132p and the second input terminal IN2 of the multiplexer 132a.

The read register selector 130 having the above-described structure starts its operation in response to an input of the shift enable signal WS in a high state, and sequentially transmits the sixteen write enable signals REN0-REN15 by raising one at a time to the read terminals ren (see FIG. 3) of the sixteen registers REG0-REG15, respectively. Also, in response to an input of the reset signal RST in a high state, the read register selector 130 transmits the read enable signal REN0 in a high state and the read enable signals REN1-REN15 in a low state.

Figure 6:
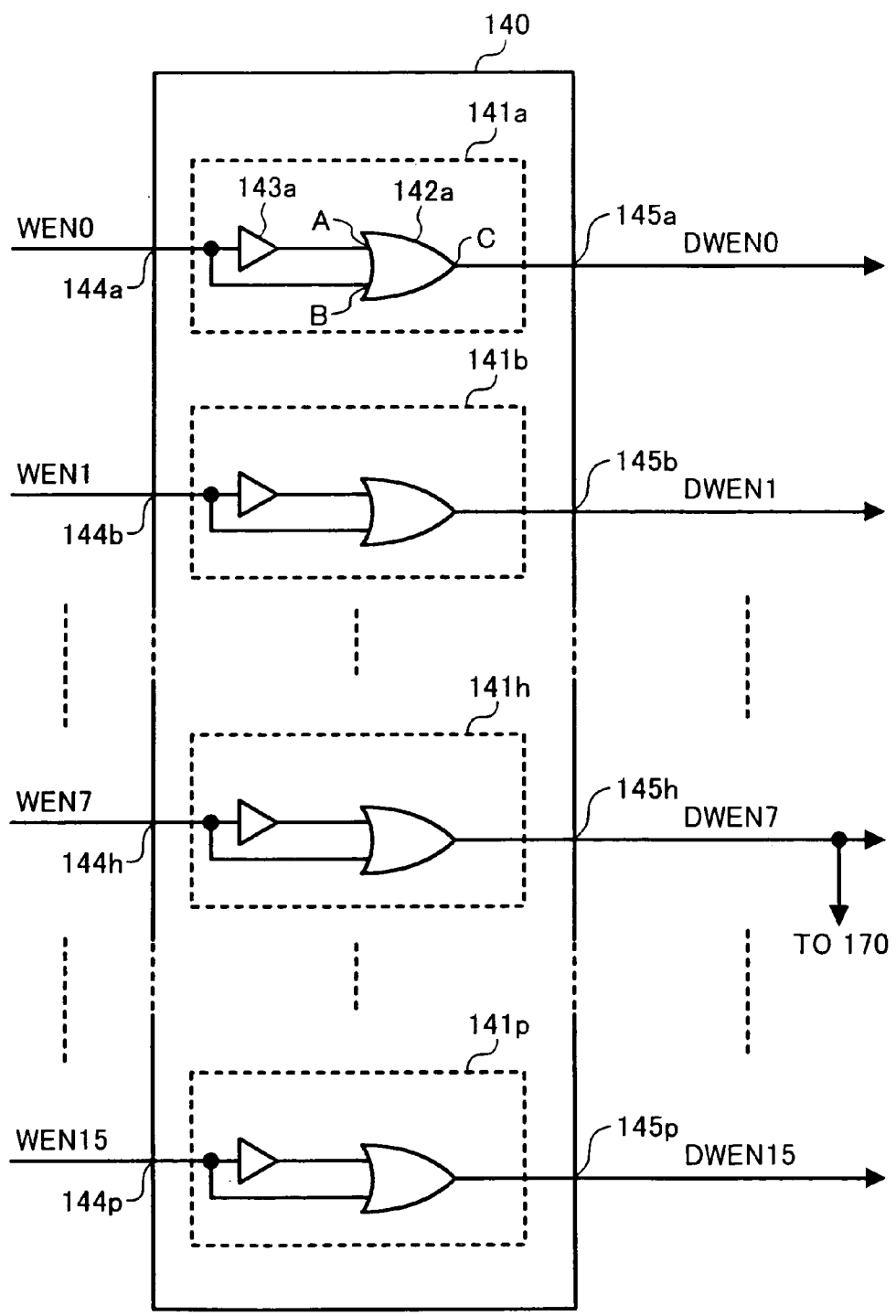
FIG. 6 is a schematic circuit block diagram of a duty adjuster shown in FIG. 2.

Referring to FIG. 6, an exemplary structure and an operation of the duty adjuster 140 are explained. The duty adjuster 140 includes sixteen adjusting circuits 141a-141p. Each of the adjusting circuits 141a-141p includes an OR gate and a buffer element. For example, in FIG. 6, the adjusting circuit 141a includes an OR gate 142a and a buffer element 143a. The duty adjuster 140 is provided with sixteen input terminals 144a-144p and sixteen output terminals 145a-145p. The input terminals 144a-144p are connected internally to the input terminals of the buffer element 143a and the OR gate 142a and externally to the output terminals (not shown) for the write enable signals WEN0-WEN15, respectively. Accordingly, the write enable signals WEN0-WEN15 output from the write register selector 120 are transmitted to the input terminals 144a-144p, respectively. The adjusting circuits 141a-141p output resultant signals as the write enable signals DWEN0-DWEN15, which have been undergone an adjustment of the active duty ratio.

Figure 7:
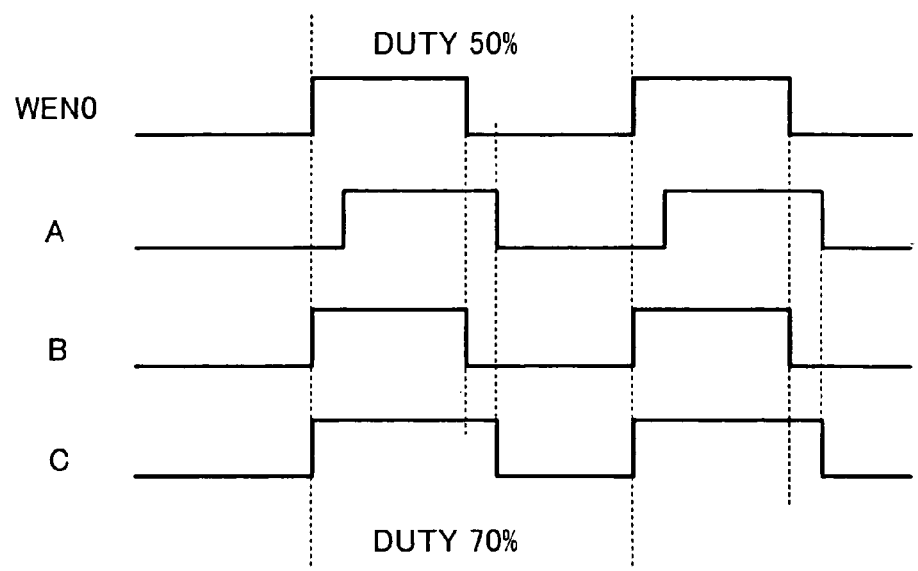
FIG. 7 is a time chart showing a relationship among input signals to an OR circuit provided for a write enable signal WEN0, for example, in the duty adjuster and a resultant output signal from the OR circuit.

Operations of the adjusting circuits 141a-141p are explained below with reference to FIG. 7, by taking an example of the adjusting circuit 141a. In the adjusting circuit 141a, the OR gate 142a has two inputs terminals A and B, to one of which an output from the buffer element 143a is input, and one output terminal C. FIG. 7 is a time chart showing relationships among the enable signal WEN0, input signals to the input terminals A and B, and an output signal from the output terminal C. As shown in FIG. 7, the output signal from the output terminal C of the OR gate 142a is in a high state for a time period extended by a delay time of the buffer element 143a so that the active duty ratio of this output signal from the output terminal C of the OR gate 142a is adjusted from approximately 50% to approximately 70%. This value of approximately 70% is one example and may be altered to any other values greater than 50% and possibly different among the adjusting circuits 141a-141p unless the clock synchronizer 150 operates in a proper and accurate manner.

Figure 8:
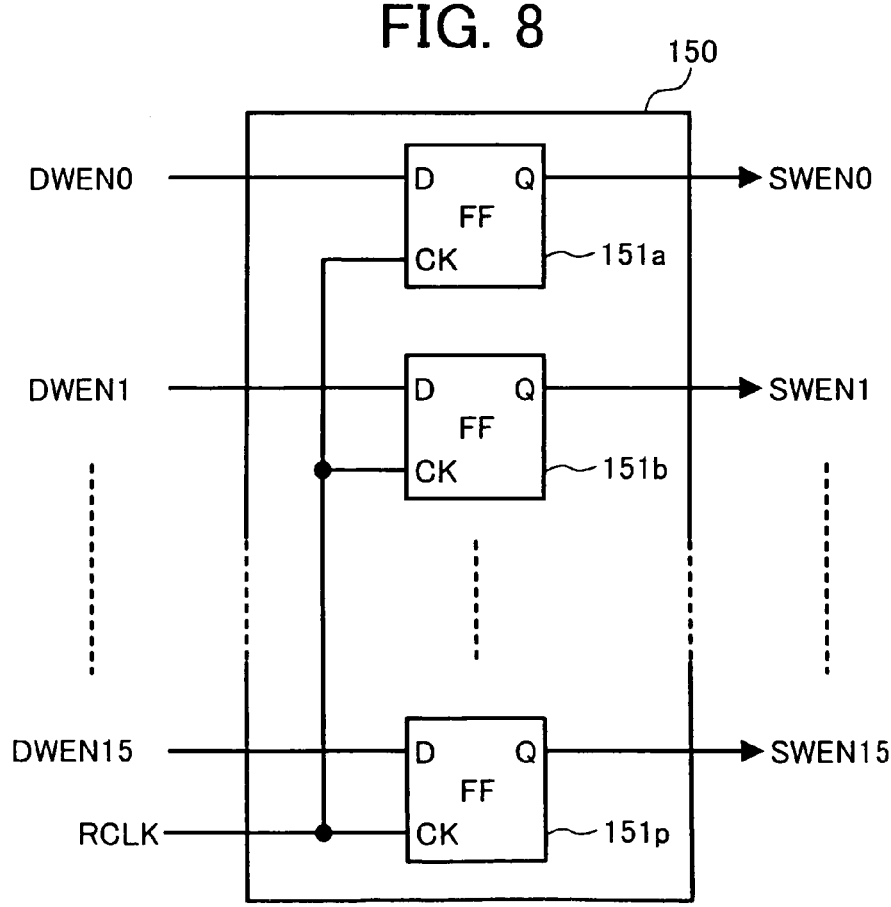
FIG. 8 is a schematic circuit block diagram of a clock synchronizer shown in FIG. 2.

Referring to FIG. 8, an exemplary operation of the clock synchronizer 150 is explained. As illustrated in FIG. 8, the clock synchronizer 150 includes sixteen D-type flip-flop (hereinafter referred to as DFF) circuits 151a-151p each having a data input terminal D, a clock terminal CK, and an output terminal Q. The enable signals DWEN0-DWEN15 adjusted to the 70%-duty ratio and output from the duty adjuster 140 are input to the data input terminals D of the DFF circuits 151a-151p. The read clock signal RCLK is input to each of the clock terminals CK. The DFF circuits 151a-151p synchronizes the enable signals DWEN0-DWEN15, respectively, with the read clock signal RCLK and outputs resultant signals in synchronism with the read clock signal RCLK, which are referred to as the RCLK-synchronized enable signals SWEN0-SWEN15. The clock synchronizer 150 ultimately outputs the RCLK-synchronized enable signals SWEN0-SWEN15.

Since the active duty ratio of the write enable signals WEN0-WEN15 have been changed to approximately 70% by the duty adjuster 140, the DFF circuits 151a-151p can reliably catch the changes of the states of the write enable signals DWEN0-DWEN15, respectively, from the low state to the high state, so that the clock synchronizer 150 can perform the clock synchronization operation in an accurate manner.

In addition, the cycles of the write enable signals WEN and the read enable signals REN generated based on clock signals which may be different from each other can be made in agreement with each other by the operations of the duty adjuster 140 and the clock synchronizer 150. By this feature, an accuracy of a detection operation performed by the address proximity detector 160 is increased, which details are explained later.

The address proximity detector 160 compares values of the RCLK-synchronized write enable signals SWEN0-SWEN15 directly to values of the read enable signals REN0-REN15 and detects an event in that the high level signal shifting among the write enable signals SWEN0-SWEN15 and the high level signal shifting among the read enable signals REN0-REN15 are next to each other relative to the 16-bit shift ring of the registers REG0-REG15. In such an event, the address proximity detector 160 outputs the reset signals RST in a high state to the write register selector 120 and the read register selector 130.

Figure 9:
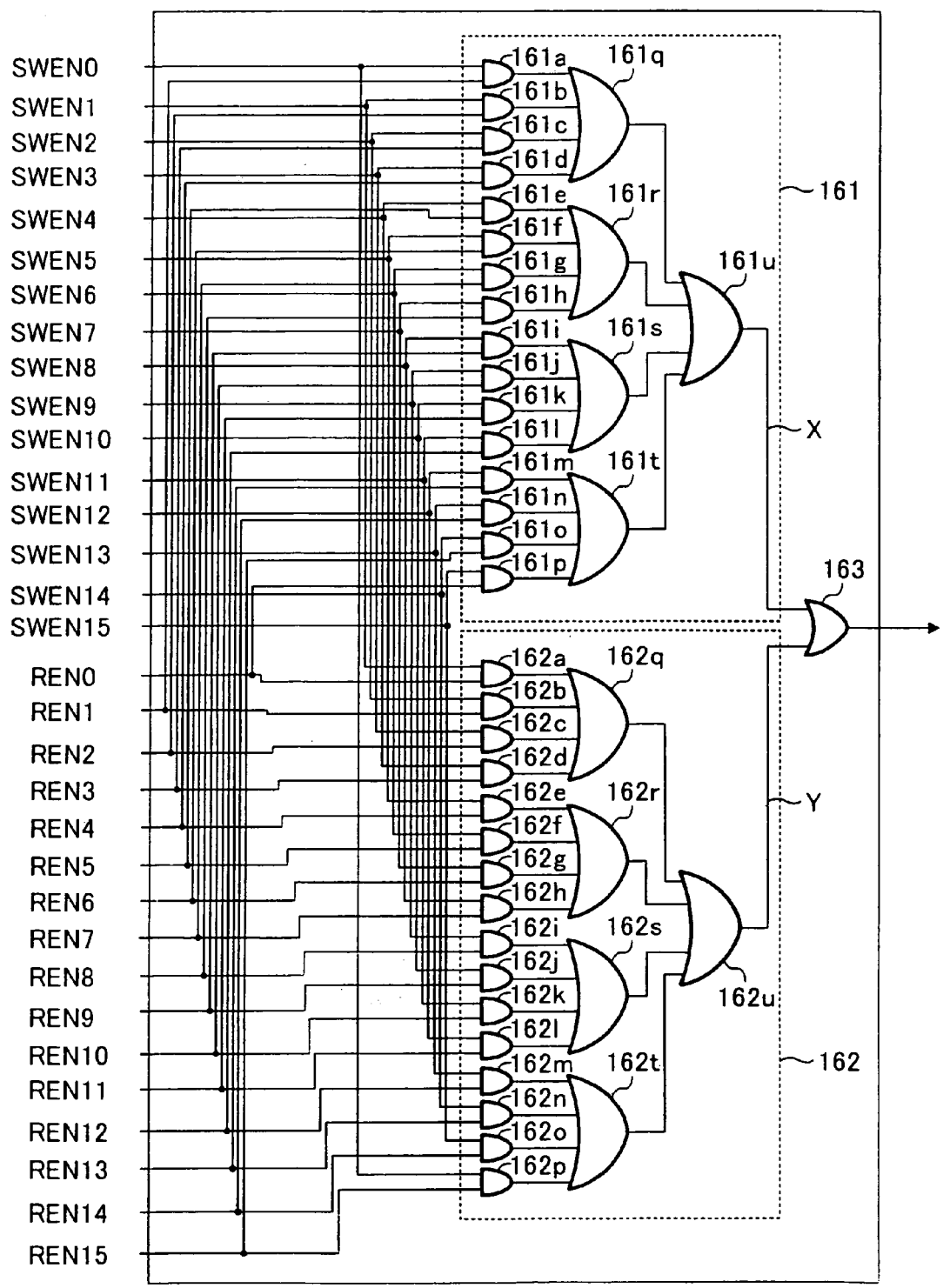
FIG. 9 is a schematic circuit block diagram of an address proximity detector shown in FIG. 2.

As shown in FIG. 9, the address proximity detector 160 includes an overflow detector 161, an underflow detector 162, and a two-input OR gate 163. The overflow detector 161 includes two-input AND gates 161a-161p, four-input OR gates 161q-161t, and a four-input OR gate 161u. The underflow detector 162 includes two-input AND gates 162a-162p, four-input OR gates 162q-162t, and a four-input OR gate 162u.

The AND gate 161a receives the write enable signal SWEN0 and the read enable signal REN1. The AND gate 161b receives the write enable signal SWEN1 and the read enable signal REN2. The AND gate 161c receives the write enable signal SWEN2 and the read enable signal REN3. The AND gate 161d receives the write enable signal SWEN3 and the read enable signal REN4. The AND gate 161e receives the write enable signal SWEN4 and the read enable signal RENS. The AND gate 161f receives the write enable signal SWEN5 and the read enable signal REN6. The AND gate 161g receives the write enable signal SWEN6 and the read enable signal REN7. The AND gate 161h receives the write enable signal SWEN7 and the read enable signal REN8. The AND gate 161i receives the write enable signal SWEN8 and the read enable signal REN9. The AND gate 161j receives the write enable signal SWEN9 and the read enable signal REN10. The AND gate 161k receives the write enable signal SWEN10 and the read enable signal REN11. The AND gate 161l receives the write enable signal SWEN11 and the read enable signal REN12. The AND gate 161m receives the write enable signal SWEN12 and the read enable signal REN13. The AND gate 161n receives the write enable signal SWEN13 and the read enable signal REN14. The AND gate 161o receives the write enable signal SWEN14 and the read enable signal REN15. The AND gate 161p receives the write enable signal SWEN15 and the read enable signal REN0.

The OR gate 161q receives outputs from the AND gates 161a-161d. The OR gate 161r receives outputs from the AND gates 161e-161h. The OR gate 161s receives outputs from the AND gates 161i-161l. The OR gate 161t receives outputs from the AND gates 161m-161p. The OR gate 161u receives outputs from the OR gates 161q-161t and outputs an overflow signal X which becomes the reset signal RST through the OR gate 163.

The AND gate 162a receives the write enable signal SWEN1 and the read enable signal REN0. The AND gate 162b receives the write enable signal SWEN2 and the read enable signal REN1. The AND gate 162c receives the write enable signal SWEN3 and the read enable signal REN2. The AND gate 162d receives the write enable signal SWEN4 and the read enable signal REN3. The AND gate 162e receives the write enable signal SWEN5 and the read enable signal REN4. The AND gate 162f receives the write enable signal SWEN6 and the read enable signal REN5. The AND gate 162g receives the write enable signal SWEN7 and the read enable signal REN6. The AND gate 162h receives the write enable signal SWEN8 and the read enable signal REN7. The AND gate 162i receives the write enable signal SWEN9 and the read enable signal REN8. The AND gate 162j receives the write enable signal SWEN10 and the read enable signal REN9. The AND gate 162k receives the write enable signal SWEN11 and the read enable signal REN10. The AND gate 162l receives the write enable signal SWEN12 and the read enable signal REN11. The AND gate 162m receives the write enable signal SWEN13 and the read enable signal REN12. The AND gate 162n receives the write enable signal SWEN14 and the read enable signal REN13. The AND gate 162o receives the write enable signal SWEN15 and the read enable signal REN14. The AND gate 162p receives the write enable signal SWEN0 and the read enable signal REN15.

The OR gate 162q receives outputs from the AND gates 162a-162d. The OR gate 162r receives outputs from the AND gates 162e-162h. The OR gate 162s receives outputs from the AND gates 162i-162l. The OR gate 162t receives outputs from the AND gates 162m-162p. The OR gate 162u receives outputs from the OR gates 162q-162t and outputs an underflow signal Y which becomes the reset signal RST through the OR gate 163.

In the buffer circuit 100, data can accumulate in the registers REG0-REG15 of the memory 110 when the write clock signal WCLK is faster than the read clock signal RCLK. In one case, under this circumstance, the then-effective write enable signal selects a register among the registers REG0-REG15 immediately next, from behind, to the register selected by the then-effective read enable signal. The overflow detector 161 detects such a case and regards this case as an overflow case. On the other hands, when the read clock signal RCLK is faster than the write clock signal WCLK, the then-effective read enable signal selects a register among the registers REG0-REG15 immediately next, from behind, to the register selected by the then-effective write enable signal. The underflow detector 162 detects such a case and regards this case as an underflow case.

As described above, the overflow detector 161 detects an event in which a register immediately next, from behind, to the register selected by the then-effective read enable signal is selected by the then-effective write enable signal. In this event, the AND gate 161a receiving the read enable signal REN1 and the write enable signal SWEN0 that designates a register immediately next, from behind, to a register designated by the read enable signal REN1 detects an event in which the read enable signal REN1 and the write enable signal SWEN0 are both in high states. In the same way, each of the subsequent AND gates 161b-161p is configured to detect an event in which the corresponding input read enable signal and the corresponding input write enable signal are both in high states, in which the corresponding input write enable signal designates a register immediately next, from behind, to a register designated by the read enable signal.

The OR gate 161q outputs a signal in a high state when detecting an event in that one of the AND gates 161a-161d outputs a signal in a high state. Likewise, each of the OR gates 161r, 161s, and 161t outputs a signal in a high state when detecting an event in that one of the correspondingly connected AND gates outputs a signal in a high state. The OR gate 161u outputs the overflow signal X in a high state when detecting an event that one of the AND gates 161q, 161r, 161s, and 161t outputs a signal in a high state.

On the other hand, the underflow detector 162 detects an event in which a register immediately next, from behind, to the register selected by the then-effective write enable signal is selected by the then-effective read enable signal. In this event, the AND gate 162a receiving the write enable signal SWEN1 and the read enable signal REN0 that designates a register immediately next, from behind, to a register designated by the write enable signal SWEN1 detects an event in which the read enable signal REN0 and the write enable signal SWEN1 are both in high states. In the same way, each of the subsequent AND gates 162b-162p is configured to detect an event in which the corresponding input read enable signal and the corresponding input write enable signal are both in high states, in which the corresponding input read enable signal designates a register immediately next, from behind, to a register designated by the write enable signal.

The OR gate 162q outputs a signal in a high state when detecting an event that one of the AND gates 162a-162d outputs a signal in a high state. Likewise, each of the OR gates 162r, 162s, and 162t outputs a signal in a high state when detecting an event in that one of the correspondingly connected AND gates outputs a signal in a high state. The OR gate 162u outputs the underflow signal Y in a high state when detecting an event in that one of the AND gates 162q, 162r, 162s, and 162t outputs a signal in a high state.

The gate 163 outputs the reset signal RST in a high state when detecting an event in that one of the overflow signal X and the underflow signal Y becomes in a high state.

Figure 10:
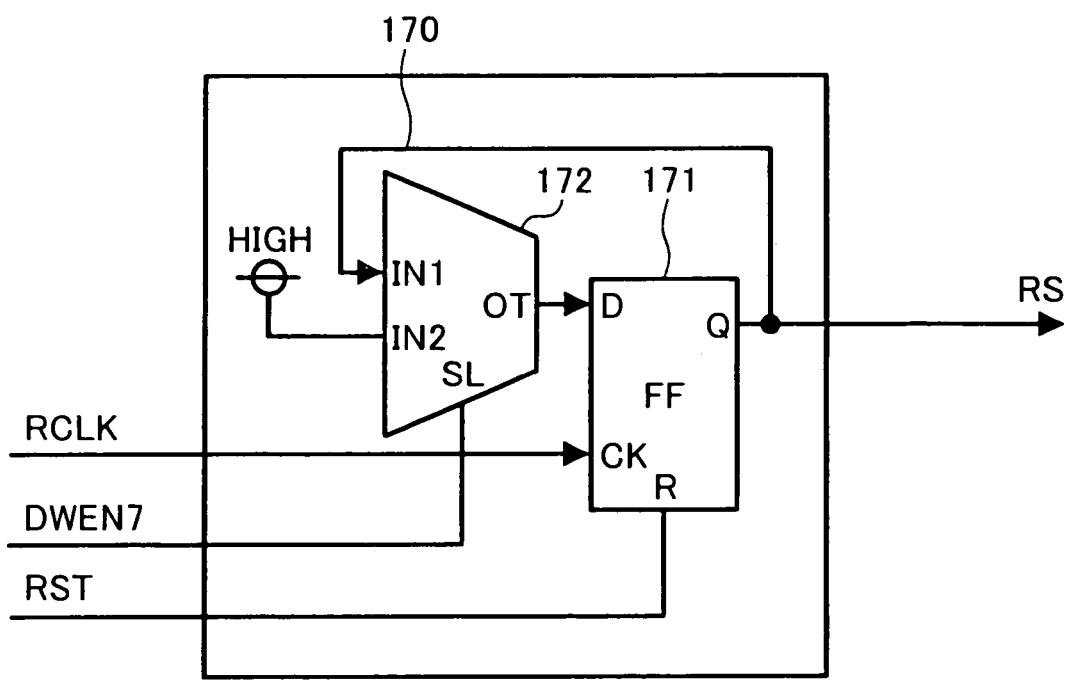
FIG. 10 is a schematic circuit block diagram of a read controller shown in FIG. 2.

Referring to FIG. 10, an exemplary operation of the read controller 170 is explained. As illustrated in FIG. 10, the read controller 170 includes a D-type flip-flop (hereinafter referred to as DFF) circuit 171 and a multiplexer (MUX) 172. The DFF circuit 171 has a data input terminal D, a data output terminal Q, a clock input terminal CK, and a reset terminal R. The multiplexer 172 has first and second input terminals IN1 and IN2, a selection terminal SL, and an output terminal OT.

The multiplexer 172 receives an output from the data output terminal Q of the DFF circuit 171 at the first input terminal IN1 and a power supply voltage Vcc, a high voltage, at the second input terminal IN2. The write enable signal DWEN7 in a high state is input to the selection terminal SL of the multiplexer 172. The DFF circuit receives an output from the output terminal OT of the multiplexer 172 at the data input terminal D and the read clock signal RCLK at the clock input terminal CK. The reset signal RST is input to the reset terminal R of the DFF circuit 171. The output from the data output terminal Q of the DFF circuit 171 is sent, in addition to as the shift enable signal to the read register selector 130.

The multiplexer 172 outputs the power supply voltage Vcc input to the second input terminal IN2 in response to the input of the write enable signal DWEN7 in a high state from the output terminal OT, and the output signal from the data output terminal Q of the DFF circuit 171 input to the first input terminal IN2 in response to the input of the write enable signal DWEN7 in a low state from the output terminal OT.

In the read controller 170 having the above-described structure, the DFF circuit 171 outputs the shift enable signal RS in a high state upon a completion of writing data into an eighth register sequentially counted from a register to which the writing is started so as to activate the read register selector 130. Thereby, as illustrated in FIG. 2, the read enable signal is output to follow the write enable signal with a delay of eight registers.

Numerous additional modifications and variations are possible in light of the above teachings. It is therefore to be understood that within the scope of the appended claims, the disclosure of this patent specification may be practiced otherwise than as specifically described herein. For example, elements and/or features of different illustrative embodiments may be combined with each other and/or substituted for each other within the scope of this disclosure and appended claims.

This patent specification is based on Japanese patent application No. JPAP2003-125066 filed on Apr. 30, 2003, in the Japanese Patent Office, the entire contents of which are incorporated by reference herein.

What is claimed is:

1. An I/O interface including a buffer circuit comprising:
a memory including a plurality of registers;
a write register selector configured to operate in synchronism with a write clock signal and to output a plurality of write enable signals corresponding to said plurality of registers, respectively, and enabling a first selected one of the plurality of registers, one at a time and in a first predetermined sequence, to be written with data;
a read register selector configured to operate in synchronism with a read clock signal and to output a plurality of read enable signals corresponding to said plurality of registers, respectively, and enabling a second selected one of the plurality of registers, one at a time and in a second predetermined sequence, to be read; and
an address proximity detector configured to detect an event in which a difference in position between a register write-enabled by one of the write enable signals and a different register read-enabled by one of the read enable signals among the plurality of registers is equal to a predetermined value and to output a reset signal upon detecting such event.

2. An I/O interface including a buffer circuit comprising:
a memory including a plurality of registers;
a write register selector configured to operate in synchronism with a write clock signal and to output write enable signals in a first predetermined sequence for enabling a first selected one of the plurality of registers, one at a time, to be written with data;
a read register selector configured to operate in synchronism with a read clock signal and to output read enable signals in a second predetermined sequence for enabling a second selected one of the plurality of registers, one at a time, to be read;
an address proximity detector configured to detect an event in which a difference in position between a register write-enabled by one of the write enable signals and a different register read-enabled by one of the read enable signals among the plurality of registers is equal to a predetermined value and to output a reset signal upon detecting such event;
a duty ratio adjuster configured to increase an active duty ratio indicative of a time period in which one of the write enable signals output by the write register selector is in a high state in a signal cycle in comparison with another time period remaining in the signal cycle in which the one of the write enable signals output by the write register selector is in a low state; and
a clock signal synchronizer configured to synchronize the write clock signal which has undergone an increase of the active duty ratio by the duty ratio adjuster, to the read clock signal used by the read register selector,
wherein the address proximity detector is configured to detect an event in which a difference in position between a register write-enabled by the write enable signal which is synchronized to the read clock signal by the clock signal synchronizer and a different register read-enabled by the read enable signal among the plurality of registers is equal to the predetermined value and to output the reset signal upon detecting such event.

3. The I/O interface of claim 2, wherein the buffer circuit further comprises:
a read controller configured to detect a completion of a writing to a predetermined number of registers among the plurality of registers based on the write clock signal which has undergone an increase of the active duty ratio by the duty ratio adjuster and to activate the read register selector upon detecting such completion.

4. The I/O interface of claim 2, wherein said reset signal resets the write register selector and the read register selector at the same time.

5. The I/O interface of claim 2, wherein said I/O interface is used for communications according to a USB standard.

6. The I/O interface of claim 2, wherein said I/O interface is used for communications according to a serial ATA standard.

7. The I/O interface of claim 2, wherein said I/O interface is used for communications according to a PCI Ex standard.

8. An I/O interface including a buffer circuit comprising:
a memory including a plurality of registers;
a write register selector configured to output write enable signals for enabling respective first selected ones of the plurality of registers to be written with data;
a read register selector configured to output read enable signals for enabling respective second selected ones of the plurality of registers to be read; and
an address proximity detector configured to detect an event in which a difference in position between a register write-enabled by one of the write enable signals and a different register read-enabled by one of the read enable signals among the plurality of registers is equal to a predetermined value and to output a reset signal upon detecting such event,
wherein a write enable signal is supplied by the write register selector to the memory to enable one of the plurality of registers for writing without supply of a write address to the memory.

9. An I/O interface including a buffer circuit comprising:
a memory including a plurality of registers:
a write register selector configured to output write enable signals for enabling respective first selected ones of the plurality of registers to be written with data;
a read register selector configured to output read enable signals for enabling respective second selected ones of the plurality of registers to be read; and
an address proximity detector configured to detect an event in which a difference in position between a register write-enabled by one of the write enable signals and a different register read-enabled by one of the read enable signals among the plurality of registers is equal to a predetermined value and to output a reset signal upon detecting such event,
wherein the buffer circuit further comprises a duty ratio adjuster configured to increase an active duty ratio indicative of a time period in which one of the write enable signals output by the write register selector is in a high state in a signal cycle in comparison with another time period remaining in the signal cycle in which the one of the write enable signals output by the write register selector is in a low state.

10. The I/O interface of claim 9, wherein the buffer circuit further comprises a clock signal synchronizer configured to synchronize the write clock signal which has undergone an increase of the active duty ratio by the duty ratio adjuster, to the read clock signal used by the read register selector.

11. The I/O interface of claim 9, wherein the buffer circuit further comprises a read controller configured to detect a completion of a writing to a predetermined number of registers among the plurality of registers based on the write clock signal which has undergone an increase of the active duty ratio by the duty ratio adjuster and to activate the read register selector upon detecting such completion.

12. The I/O interface of claim 8, wherein said I/O interface is configured for communications according to a USB standard.

13. The I/O interface of claim 8, wherein said I/O interface is configured for communications according to a serial ATA standard.

14. The I/O interface of claim 8, wherein said I/O interface is configured for communications according to a PCI Ex standard.

15. An I/O interface including a buffer circuit comprising:
a memory including a plurality of registers;
a write register selector configured to output write enable signals for enabling respective first selected ones of the plurality of registers to be written with data;
a read register selector configured to output read enable signals for enabling respective second selected ones of the plurality of registers to be read; and
an address proximity detector configured to detect an event in which a difference in position between a register write-enabled by one of the write enable signals and a different register read-enabled by one of the read enable signals among the plurality of registers is equal to a predetermined value and to output a reset signal upon detecting such event,
wherein a read enable signal is supplied by the read register selector to the memory to enable one of the plurality of registers for reading without supply of a read address to the memory.

16. The I/O interface of claim 15, wherein said I/O interface is configured for communications according to a USB standard.

17. The I/O interface of claim 15, wherein said I/O interface is configured for communications according to a serial ATA standard.

18. The I/O interface of claim 15, wherein said I/O interface is configured for communications according to a PCI Ex standard.

19. The I/O interface of claim 9, wherein said I/O interface is configured for communications according to a USB standard.

20. The I/O interface of claim 9, wherein said I/O interface is configured for communications according to a serial ATA standard.

21. The I/O interface of claim 9, wherein said I/O interface is configured for communications according to a PCI Ex standard.

* * * * *